(12) United States Patent
Krishnan et al.

(10) Patent No.: US 9,997,485 B2
(45) Date of Patent: Jun. 12, 2018

(54) BONDING STRUCTURE AND METHOD

(71) Applicant: Semiconductor Components Industries, LLC, Phoenix, AZ (US)

(72) Inventors: Shutesh Krishnan, Seremban (MY); Yun Sung Won, Bayan Lepas (MY)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days. days.

(21) Appl. No.: 15/663,802

(22) Filed: Jul. 30, 2017

(65) Prior Publication Data
US 2017/0352635 A1    Dec. 7, 2017

Related U.S. Application Data

(62) Division of application No. 14/339,524, filed on Jul. 24, 2014, now Pat. No. 9,780,059, which is a division
(Continued)

(51) Int. Cl.
*H01L 23/00* (2006.01)
*H01L 23/495* (2006.01)

(52) U.S. Cl.
CPC ........ *H01L 24/27* (2013.01); *H01L 23/49513* (2013.01); *H01L 23/49524* (2013.01); *H01L 24/29* (2013.01); *H01L 24/36* (2013.01); *H01L 24/40* (2013.01); *H01L 24/83* (2013.01); *H01L 24/48* (2013.01); *H01L 24/73* (2013.01); *H01L 2224/16225* (2013.01); *H01L 2224/27318* (2013.01); *H01L 2224/27334* (2013.01); *H01L 2224/29* (2013.01); *H01L 2224/293* (2013.01); *H01L 2224/29006* (2013.01); *H01L 2224/2929* (2013.01); *H01L 2224/29101* (2013.01); *H01L 2224/29199* (2013.01); *H01L 2224/29299* (2013.01); *H01L 2224/32013* (2013.01); *H01L 2224/32145* (2013.01); *H01L 2224/32225* (2013.01); *H01L 2224/32245* (2013.01); *H01L 2224/33181* (2013.01); *H01L 2224/40245* (2013.01); *H01L 2224/48091* (2013.01); *H01L 2224/48227* (2013.01); *H01L 2224/48235* (2013.01); *H01L 2224/48247* (2013.01); *H01L 2224/73263* (2013.01);
(Continued)

(58) Field of Classification Search
CPC ............... H01L 24/27; H01L 23/49513; H01L 23/49524; H01L 24/36
USPC ...................... 438/460, 686; 75/684; 164/61; 257/701, 676
See application file for complete search history.

(56) References Cited

U.S. PATENT DOCUMENTS 7,083,850 B2   8/2006  Rasiah
7,311,135 B1   12/2007  Suganuma et al.
(Continued)

FOREIGN PATENT DOCUMENTS

EP   1 578 559 B1    3/2009
JP   5-329681 H      12/1993
(Continued)

*Primary Examiner* — Bo Fan
(74) *Attorney, Agent, or Firm* — Rennie William Dover

(57) ABSTRACT

A bonding structure and a method for bonding components, wherein the bonding structure includes a nanoparticle preform. In accordance with embodiments, the nanoparticle preform is placed on a substrate and a workpiece is placed on the nanoparticle preform.

20 Claims, 6 Drawing Sheets

Related U.S. Application Data of application No. 12/901,684, filed on Oct. 11, 2010, now abandoned.

(52) U.S. Cl.
CPC ............ *H01L 2224/73265* (2013.01); *H01L 2224/838* (2013.01); *H01L 2224/83048* (2013.01); *H01L 2224/8384* (2013.01); *H01L 2224/83101* (2013.01); *H01L 2224/83192* (2013.01); *H01L 2224/83203* (2013.01); *H01L 2224/92* (2013.01); *H01L 2224/92247* (2013.01); *H01L 2924/00013* (2013.01); *H01L 2924/01005* (2013.01); *H01L 2924/0105* (2013.01); *H01L 2924/01006* (2013.01); *H01L 2924/01013* (2013.01); *H01L 2924/01024* (2013.01); *H01L 2924/01025* (2013.01); *H01L 2924/01029* (2013.01); *H01L 2924/01033* (2013.01); *H01L 2924/01046* (2013.01); *H01L 2924/01047* (2013.01); *H01L 2924/01049* (2013.01); *H01L 2924/01051* (2013.01); *H01L 2924/01057* (2013.01); *H01L 2924/01058* (2013.01); *H01L 2924/01078* (2013.01); *H01L 2924/01079* (2013.01); *H01L 2924/01082* (2013.01); *H01L 2924/14* (2013.01); *H01L 2924/15311* (2013.01); *H01L 2924/15747* (2013.01); *H01L 2924/15787* (2013.01); *H01L 2924/181* (2013.01); *H01L 2924/19105* (2013.01); *H01L 2924/351* (2013.01)

(56) References Cited

U.S. PATENT DOCUMENTS

| | | | |
|---|---|---|---|
| 7,327,039 B2 | 2/2008 | Charles et al. | |
| 7,482,201 B2 | 1/2009 | Charles et al. | |
| 7,874,472 B2 | 1/2011 | Lee et al. | |
| 8,257,795 B2 | 9/2012 | Lu et al. | |
| 2004/0180203 A1 | 9/2004 | Yadav et al. | |
| 2004/0245648 A1 | 12/2004 | Nagasawa et al. | |
| 2005/0179012 A1* | 8/2005 | Kwon | C09K 9/02 252/582 |
| 2006/0090997 A1 | 5/2006 | Goto et al. | |
| 2006/0160330 A1 | 7/2006 | Kobayashi et al. | |
| 2008/0127777 A1 | 6/2008 | Motegi et al. | |
| 2008/0303161 A1 | 12/2008 | Kobayashi et al. | |
| 2009/0033001 A1* | 2/2009 | Kozuka | B01J 13/02 264/328.17 |
| 2009/0288519 A1 | 11/2009 | Arai et al. | |
| 2010/0246009 A1* | 9/2010 | Polley | C23C 16/006 359/578 |
| 2010/0282429 A1 | 11/2010 | Arai et al. | |

FOREIGN PATENT DOCUMENTS

| | | |
|---|---|---|
| JP | 2006265686 A | 10/2006 |
| JP | 2008-311371 A | 12/2008 |

\* cited by examiner

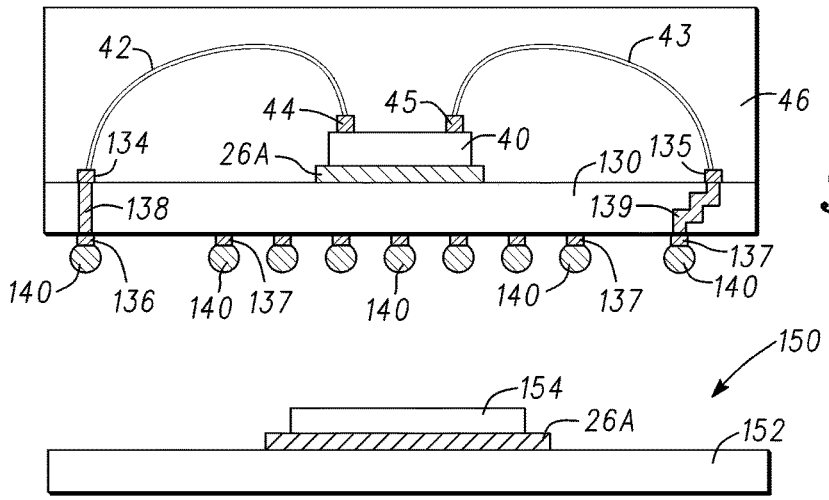
*Fig. 12*
*Fig. 13*
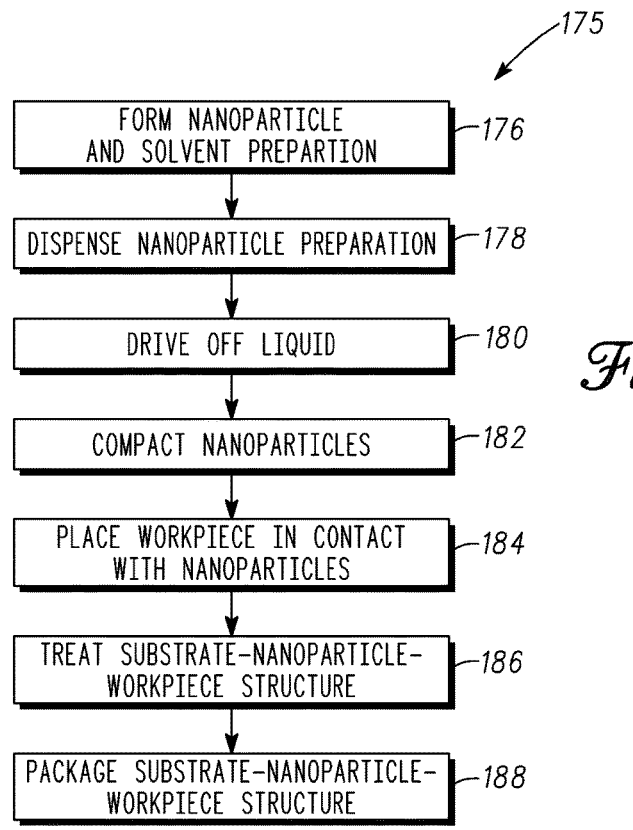
*Fig. 14*

BONDING STRUCTURE AND METHOD

The present application is a division application of U.S. patent application Ser. No. 14/339,524 filed on Jul. 24, 2014, by Shutesh Krishnan et al., titled "Bonding Structure and Method" which is a division application of U.S. patent application Ser. No. 12/901,684 filed on Oct. 11, 2010, by Shutesh Krishnan et al., titled "Bonding Structure and Method", which is hereby incorporated by reference in its entirety, and priority thereto for common subject matter is hereby claimed.

TECHNICAL FIELD

The present invention relates, in general, to bonding and, more particularly, to lead-free bonding.

BACKGROUND

Semiconductor component manufacturers are constantly striving to increase the performance of their products while decreasing their cost of manufacture. A cost intensive area in the manufacture of semiconductor components is packaging the semiconductor chips that contain the semiconductor devices. As those skilled in the art are aware, discrete semiconductor devices and integrated circuits are fabricated from semiconductor wafers, which are then singulated or diced to produce semiconductor chips. Typically, one or more semiconductor chips is attached to a support substrate such as a metal leadframe using a solder die attach material and encapsulated within a mold compound to provide protection from environmental and physical stresses.

A drawback with attaching a semiconductor chip to a support substrate using a solder die attach material is that the solder typically contains lead which may cause environmental issues. Another drawback is that the amount of heat used to cause solder containing lead to flow is sufficiently high to thermally stress the semiconductor component.

Accordingly, it would be advantageous to have a bonded structure and a method for bonding elements that reduces the use of lead and lowers the thermal budget. It would be advantageous for the bonded structure and bonding method to be cost and time efficient to implement.

BRIEF DESCRIPTION OF THE DRAWINGS

The present invention will be better understood from a reading of the following detailed description, taken in conjunction with the accompanying drawing figures, in which like reference characters designate like elements and in which:

FIG. 12 is a cross-sectional view of a semiconductor component during manufacture in accordance with an embodiment of the present invention;

FIG. 13 is a cross-sectional view of a semiconductor component during manufacture in accordance with an embodiment of the present invention;

FIG. 14 is a flow diagram illustrating a method for manufacturing a semiconductor component in accordance with embodiments of the present invention;

DETAILED DESCRIPTION

Generally, the present invention provides a bonding structure and a method for lead-free bonding of structures. In accordance with embodiments of the present invention, a structure such as, for example a semiconductor component is manufactured by providing a nanoparticle preparation and compacting the nanoparticle preparation. The nanoparticle preparation may be comprised of nanoparticles, a mixture of different types of nanoparticles, nanoparticles derived by suspending the nanoparticles in a liquid, a mixture of different types of nanoparticles derived from by suspending the different types of nanoparticles in a liquid, or the like. The nanoparticle preparation may be placed or applied to a substrate such as, for example a mold in preparation for compaction. The nanoparticles may be compacted by applying a pressure to them that may come from a mechanical source or a pneumatic source and the pressure may be applied statically, dynamically, or statically and dynamically. After compaction the nanoparticle structure may be cut or formed into the desired shape and size. Alternatively, the nanoparticle preparation may be compacted on a substrate such as for example, a leadframe, a printed circuit board, a ceramic substrate, a laminated plastic substrate, a clip, paper laminates, plastic laminates, a semiconductor wafer, or the like.

Figure 1:
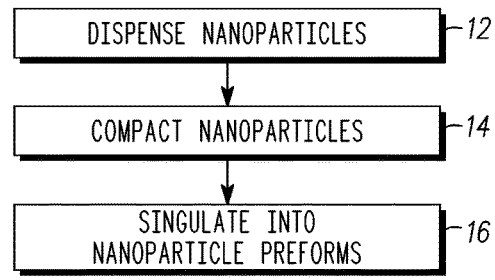
FIG. 1 is a flow diagram illustrating a method for forming a nanoparticle preform in accordance with embodiments of the present invention.

FIG. 1 is a flow diagram 10 illustrating a method for forming a nanoparticle preform for use in manufacturing semiconductor components in accordance with embodiments of the present invention. In a beginning step indicated by box 12 of FIG. 1, nanoparticles having a predefined volume or density are dispensed into, for example, a casting mold. Suitable nanoparticles include metals, such as, for example, lithium (Li), aluminum, (Al), titanium (Ti), chromium (Cr), manganese (Mn), cobalt (Co), nickel (Ni), copper (Cu), germanium (Ge), yttrium (Y), cadmium (Cd), indium (In), tin (Sn), antimony (Sb), lanthanum (La), cerium (Ce), platinum (Pt), gold (Au), bismuth (Bi), lead (Pb), palladium (Pd), etc. in their metallic form; metal alloys; metal oxides; nitrided metals; or the like; metals coated with oxides; metals coated with other metals; metals coated with one or more organic materials, or the like. Preferably, the nanoparticles have a particle size that is less than substantially 500 nanometers (nm). The nanoparticles serve as a precursor to a nanoparticle structure. In accordance with alternative embodiments, the nanoparticles may be screen printed onto the mold, condensed onto the mold, injected to the mold cavity in a technique similar to an injection molding method, dispensed into the mold cavity using particle dispensing methods known to those skilled in the art, etc.

After dispensing or forming the nanoparticles onto the casting mold they are compressed or compacted (indicated by box 14 in FIG. 1) by applying pressure and heat to the nanoparticles. The pressure may be mechanically generated or pneumatically generated and may be applied statically, dynamically, or statically and dynamically. By way of example, the applied pressure is less than about 20 Mega-Pascals (MPa) at a temperature of less than about 400 degrees Celsius (° C.). Compaction may also be formed in an ambient such as, for example, an atmospheric ambient, an ambient comprising an inert gas, an ambient comprising a vacuum, etc. Thus, variables that can be adjusted to compact or compress the nanoparticles include the ambient, temperature, pressure, drying time or conditions, or combinations thereof. Compaction of the nanoparticles forms a nanoparticle structure that may be referred to as a sheet, or a film, or a pallet. Alternatively, the nanoparticle preparation can be compressed or compacted by applying ultrasonic energy to the nanoparticles, or applying a magnetic pulse to the nanoparticles, or applying pressure to the nanoparticles, or combinations thereof.

The nanoparticle sheet may be singulated into preforms having a desired shape and size (indicated by box 16 in FIG. 1). Nanoparticle preform 26 may be referred to as a NanoPac and is shown in FIG. 4.

Figure 2:
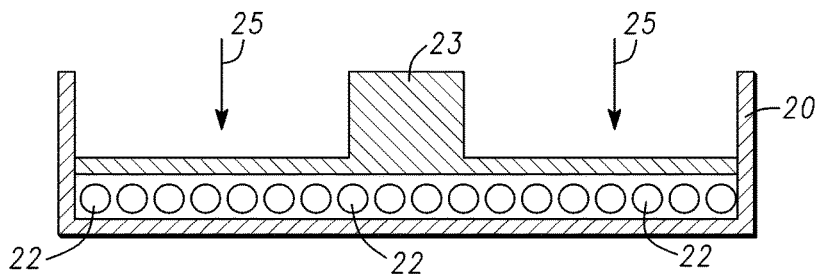
FIG. 2 is a mold in which a nanoparticle preparation is dispensed in accordance with embodiments of the present invention.
Figure 3:
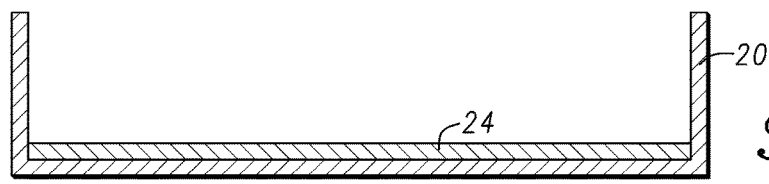
FIG. 3 is the mold of FIG. 2 after treating the nanoparticles in accordance with embodiments of the present invention.

FIG. 2 illustrates a mold 20 in which nanoparticles 22 have been dispensed. Dispensing nanoparticles 22 may be referred to as forming nanoparticles 22 or positioning nanoparticles 22. After dispensing nanoparticles 22, a compaction tool 23 applies a predefined temperature and pressure to nanoparticles 22 to form a nanoparticle structure 24 (shown in FIG. 3). Compaction is indicated in FIG. 2 by arrows 25. As described with reference to FIG. 1, nanoparticle structure 24 is removed from mold 20 and may be singulated into nanoparticle preforms 26 (shown in FIG. 4) having the desired sizes and shapes.

Figure 4:
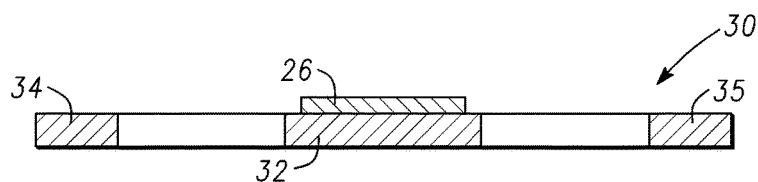
FIG. 4 is a cross-sectional view of a semiconductor component during manufacture in accordance with an embodiment of the present invention.

FIG. 4 is a cross-sectional view of a substrate 30 on which a nanoparticle preform 26 is mounted. By way of example, substrate 30 is a copper leadframe having a flag 32 and leadframe leads 34 and 35. Preferably, nanoparticle preform 26 is mounted to flag 32. Nanoparticle preform 26 is not limited to being mounted to a leadframe, but may be mounted to other substrates including a ceramic substrate, a printed circuit board, plastic, or the like.

Figure 5:
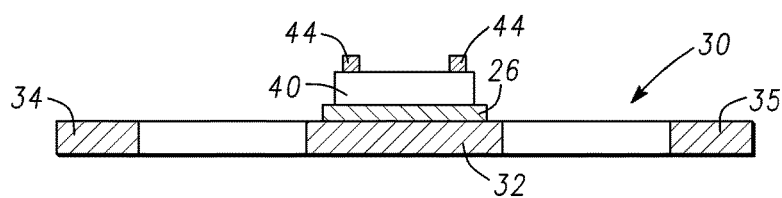
FIG. 5 is a cross-sectional view of the semiconductor component of FIG. 4 at a later stage of manufacture.

Referring now to FIG. 5, a semiconductor chip 40 is mounted to nanoparticle preform 26 which is sintered by, for example, placing nanoparticle preform 26 in an atmospheric ambient, an ambient comprising one or more inert gases, an ambient comprising a forming gas or a vacuum, and applying pressure and heat to the nanoparticle preform. The pressure may be mechanically generated or pneumatically generated and may be applied statically, dynamically, or statically and dynamically. By way of example, the applied pressure is less than about 20 MPa at a temperature of less than about 400° C.

Figure 6:
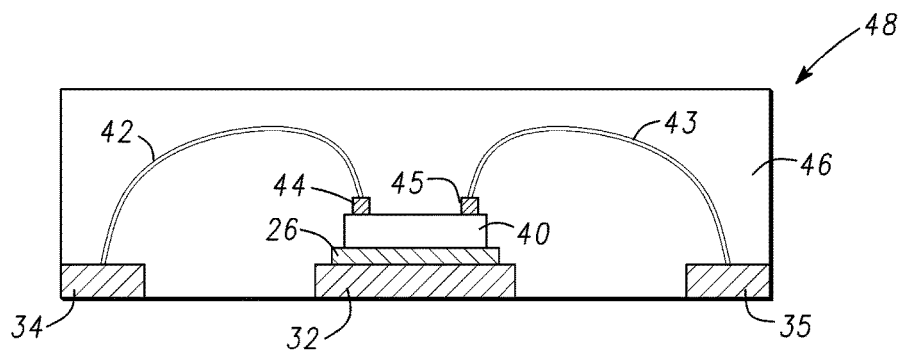
FIG. 6 is a cross-sectional view of the semiconductor component of FIG. 5 at a later stage of manufacture.

Referring now to FIG. 6, bond pad 44 is coupled leadframe lead 34 by a wire bond 42 and bond pad 45 is coupled to leadframe lead 35 by a bond wire 43. A protective material 46 such as, for example, a mold compound is formed over at least a portion of semiconductor die 40, bond wires 42 and 43, leadframe leads 34 and 35, and flag 32 to form a semiconductor component 48. Bond wires are also referred to as wire bonds.

Figure 7:
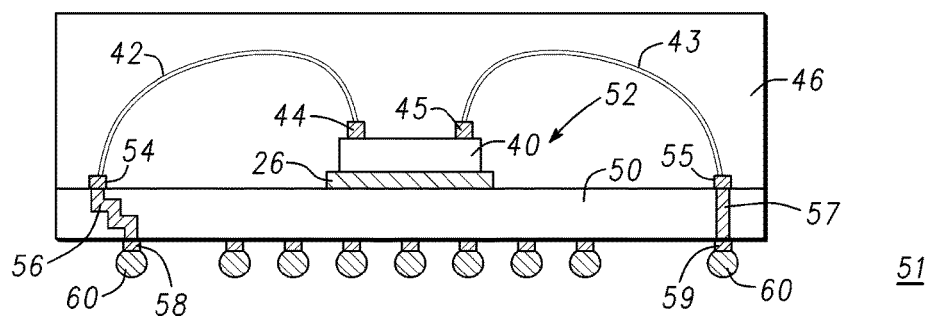
FIG. 7 is a cross-sectional view of a semiconductor component during manufacture in accordance with another embodiment of the present invention.

FIG. 7 is a cross-sectional view of a semiconductor component 51 in accordance with an embodiment in which a nanoparticle preform 26 is mounted to a printed circuit board 50 having a chip receiving area 52, bond pads 54 and 55, interconnects 56 and 57, and bond pads 58 and 59. More particularly, nanoparticle preform 26 is mounted to chip receiving area 52, bond pad 54 is coupled to bond pad 58 through interconnect 56, and bond pad 55 is coupled to bond pad 59 through an interconnect 57. Solder balls 60 are coupled to bond pads 58 and 59. As those skilled in the art are aware, a printed circuit board typically has more than two bond pads on each surface and more than two electrical interconnects extending from a bond pad on one surface to a bond pad on an opposite surface. For the sake of completeness a plurality of solder balls are shown as being bonded to corresponding bond pads on the surface of printed circuit board 50 that is opposite the surface to which semiconductor chip 40 is coupled, i.e., the solder balls are bonded to the bottom surface. When solder balls are coupled to the bond pads on the bottom surface, structure may be referred to as a ball grid array package. It should be noted that structures other than solder balls may be bonded to the bond pads on the bottom surface of printed circuit board 50. For example, pins may be coupled to bond pads such as bond pads 58 and 59 to form a pin grid array structure. Alternatively, bond pads 58 and 59 may be coupled to another substrate.

Figure 8:
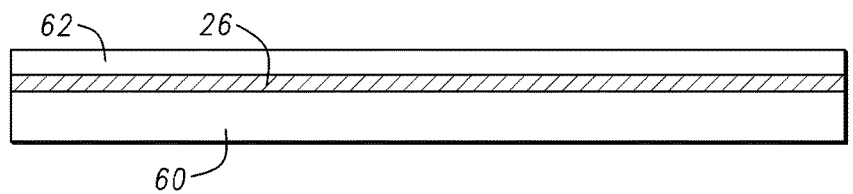
FIG. 8 is a cross-sectional view of a semiconductor component during manufacture in accordance with another embodiment of the present invention.

Referring now to FIG. 8, nanoparticle preform 26 is mounted to a ceramic substrate 60 and a structure 62 is mounted on and in contact with nanoparticle preform 26. By way of example, structure 62 is a semiconductor wafer. Alternatively, structure 62 may be a semiconductor chip, another ceramic structure, a printed circuit board, etc. Because nanoparticle preform 26 is electrically conductive, it can serve as a back side contact to structure 62 when structure 62 is a semiconductor chip, a semiconductor wafer, etc.

Figure 9:
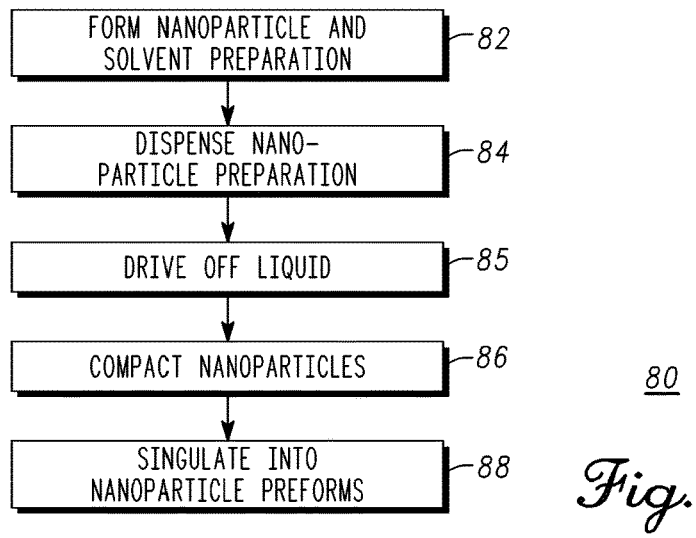
FIG. 9 is a flow diagram illustrating a method for manufacturing a semiconductor component in accordance with embodiments of the present invention.

FIG. 9 is a flow diagram 80 illustrating a method for forming a nanoparticle preform for use in manufacturing semiconductor components in accordance with embodiments of the present invention. In a beginning step 82, nanoparticles having a predefined volume or density are combined with or suspended in a liquid to form a nanoparticle suspension. Suitable examples of nanoparticles have been described with reference to FIG. 1. Suitable liquids include alcohol, acetone, organic solvents, or liquids with an evaporation temperature below the sintering temperature, or the like. Thus, the nanoparticle preparation may be comprised of an organic solution that includes nanoparticles or an aqueous solution that includes the nanoparticles. The solution may be dispensed into a mold, condensed into a mold, screen printed onto a substrate, or the like. The solution containing the nanoparticles may be referred to as a nanoparticle solution or a nanoparticle suspension. By way of example, the nanoparticle suspension is a colloidal suspension. Dispensing the nanoparticle preparation or suspension is indicated box 84.

Still referring to FIG. 9, after dispensing the nanoparticle solution into the mold, the liquid or solvent portion of the suspension is driven off or removed by, for example, evaporation (indicated by box 85). Thus, the liquid serves as a carrier for the nanoparticles. The nanoparticles are compressed or compacted by applying pressure and heat to the nanoparticle preform. The pressure may be mechanically generated or pneumatically generated and may be applied statically, dynamically, or statically and dynamically. By way of example, the applied pressure is less than about 20 MPa at a temperature of less than about 400° C. Compaction may also be carried out in an ambient such as, for example, an atmospheric ambient, an ambient comprising an inert gas, an ambient comprising a vacuum, etc. Thus, variables that can be adjusted to compact or compress the nanoparticles include the ambient, temperature, pressure, drying conditions, or combinations thereof. Alternatively, the nanoparticle preparation can be compressed or compacted by applying ultrasonic energy to the nanoparticles, or applying a magnetic pulse to the nanoparticles, or applying pressure to the nanoparticles, or combinations thereof. Compaction of the nanoparticles forms a nanoparticle structure that may be referred to as a sheet, or a film, or a pallet.

The nanoparticle sheet may be singulated into nanoparticle preforms 26 having a desired shape and size (indicated by the box 88).

Figure 10:
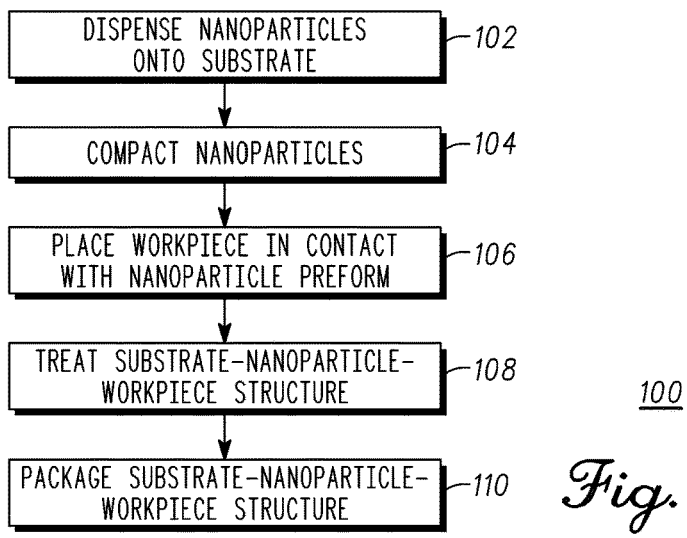
FIG. 10 is a flow diagram illustrating a method for manufacturing a semiconductor component in accordance with embodiments of the present invention.

FIG. 10 is a flow diagram 100 illustrating a method for forming a nanoparticle preform for use in manufacturing semiconductor components in accordance with embodiments of the present invention. For the sake of clarity, FIGS. 10 and 11 will be described together. In a beginning step identified by box 102, nanoparticles having a predefined volume or density are dispensed onto a substrate such as, for example, a leadframe, a printed circuit board, a ceramic substrate, or the like. Suitable examples of nanoparticles have been described with reference to FIG. 1.

After dispensing or forming the nanoparticles onto the substrate they are compressed or compacted (indicated by box 104) by applying pressure and heat to the nanoparticle preform. The pressure may be mechanically generated or pneumatically generated and may be applied statically, dynamically, or statically and dynamically. By way of example, the applied pressure is less than about 20 MPa at a temperature of less than about 400° C. Compaction may also be performed in an ambient such as, for example, an atmospheric ambient, an ambient comprising an inert gas, an ambient comprising a vacuum, etc. Thus, variables that can be adjusted to compact or compress the nanoparticles include the ambient, temperature, pressure, drying conditions, or combinations thereof. Compaction of the nanoparticles on the substrate forms a nanoparticle preform 26A (shown in FIG. 11) that is similar to nanoparticle preform 26 except that it is formed as a preform on the substrate rather than as a sheet to be singulated before application to the substrate. Nanoparticle preform 26A may be referred to as a NanoPac.

A workpiece such as, for example, a semiconductor chip 40 is mounted to nanoparticle preform 26A such that it is in contact with nanoparticle preform 26A (identified by box 106), nanoparticle preform 26A is sintered by placing nanoparticle preform 26A in a desired ambient and applying pressure and heat to the nanoparticle preform. The pressure may be mechanically generated or pneumatically generated and may be applied statically, dynamically, or statically and dynamically. By way of example, the applied pressure is less than about 20 MPa at a temperature of less than about 400° C. Sintering nanoparticle preform 26A is also referred to as heating nanoparticle preform 26A and is identified by box 108 in FIG. 10. It should be noted that the workpiece is not limited to being a semiconductor chip. Alternatively, the workpiece may be a capacitor such as, for example a chip capacitor, a resistor, such as, for example, a chip resistor, an inductor, a leadframe, a printed circuit board, clip connectors, or the like.

Figure 11:
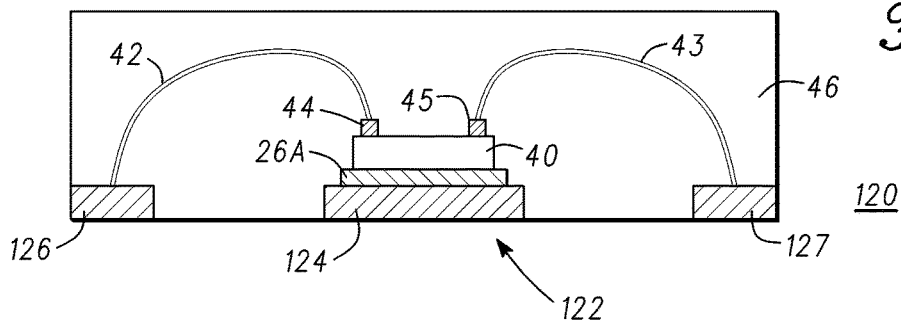
FIG. 11 is a cross-sectional view of a semiconductor component during manufacture in accordance with an embodiment of the present invention.
Figure 15:
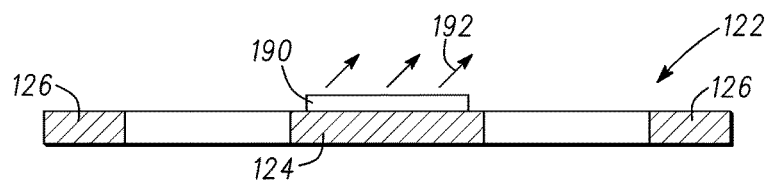
FIG. 15 is a cross-sectional view of a semiconductor component during manufacture in accordance with an embodiment of the present invention.

The substrate, semiconductor chip 40, and nanoparticle preform 26A are packaged (indicated by box 110 in FIG. 10) to form a semiconductor component 120. FIG. 11 illustrates a semiconductor component 120 in which substrate 122 is, for example, a copper leadframe having a flag 124 and leadframe leads 126 and 127, and semiconductor chip 40 is coupled to leadframe 122 via nanoparticle preform 26A. In addition, bond pad 44 is coupled to leadframe lead 126 via bond wire 42 and bond pad 45 is coupled to leadframe lead 127 via bond wire 43. A mold compound 46 is formed over at least portions of leadframe 122, semiconductor chip 40, and bond wires 42 and 43. Semiconductor chip 40, bond wires 42 and 43, and mold compound 46 have been described with reference to FIG. 6.

FIG. 12 illustrates an embodiment of a semiconductor component 129 in which the substrate is a printed circuit board 130. What is shown in FIG. 12 is printed circuit 130 having a semiconductor chip 40 coupled to a semiconductor chip receiving area 132 through a nanoparticle preform 26A. Bond pads 44 and 45 on semiconductor chip 40 are coupled to bond pads 134 and 135 on printed circuit board 130 via bond wires 42 and 43, respectively. Bond pads 134 and 135 are coupled to bond pads 136 and 137 by interconnects 138 and 139, respectively. Solder bumps 140 are coupled to corresponding bond pads 136 and 137, respectively. As those skilled in the art are aware, a printed circuit board typically has more than two bond pads on each surface and more than two electrical interconnects extending from a bond pad on one surface to a bond pad on an opposite surface. For the sake of completeness a more than two bond pads are shown on the bottom surface of printed circuit board 130 and a plurality of solder balls 140 are shown as being bonded to corresponding bond pads on the bottom surface of printed circuit 130. This structure may be referred to as a ball grid array. It should be noted that structures other than solder balls may be bonded to the bond pads on the bottom surface of printed circuit board 130. For example, pins may be coupled to bond pads such as bond pads 136 and 137 to form a pin grid array structure. Alternatively, bond pads 136 and 137 may be coupled to another substrate. It should be noted that the number of bond pads on semiconductor chip 40, the number of bond pads on printed circuit board 130, the number of bond wires, and the numbers of interconnects and solder balls are not limitations of the present invention.

A mold compound 46 is formed over at least a portion of printed circuit board 130, semiconductor chip 40, and bond wires 42 and 43. Semiconductor chip 40, bond wires 42 and 43, and mold compound 46 have been described with reference to FIG. 6.

FIG. 13 is a cross-sectional view of a structure 150 comprising a substrate 152 having a workpiece 154 coupled thereto through a nanoparticle preform 26A. It should be noted that the preform is not limited to being preform 26A, but may be a preform 26, 26B, or the like. By way of example, substrate 152 is a ceramic substrate. Workpiece 154 may be a semiconductor chip such as, for example, chip 40, a printed circuit board such as, for example, printed circuit board 130, a semiconductor wafer, another piece of ceramic material, or the like.

FIG. 14 is a flow diagram 175 illustrating a method for forming a nanoparticle preform for use in manufacturing semiconductor components in accordance with embodiments of the present invention. For the sake of clarity, FIGS. 14-17 will be described together. In addition, flow diagram 175 illustrates embodiments of a method for manufacturing the semiconductor components. In a beginning step identified by box 176, a nanoparticle suspension is prepared by combining nanoparticles with a solvent. Suitable examples of nanoparticles have been described with reference to FIG. 1. Suitable liquids include alcohol, acetone or liquids with an evaporation temperature below the sintering temperature, or the like. By way of example, the nanoparticle suspension is a colloidal suspension.

Nanoparticle suspension 190 (shown in FIG. 15) is dispensed onto a substrate such as, for example, a leadframe 122 (shown in FIG. 15), a printed circuit board 130 (shown in FIG. 17), a ceramic substrate, or the like as indicated by box 178.

After dispensing or forming nanoparticle suspension 190 onto the substrate, the solvent is driven off or removed by applying pressure and heat to the nanoparticle perform (indicated by box 180 in FIG. 14). The pressure may be mechanically generated or pneumatically generated and may be applied statically, dynamically, or statically and dynamically. By way of example, the applied pressure is less than about 20 MPa at a temperature of less than about 400° C. Driving off the solvent is indicated by arrows 192 in FIG. 15.

After the solvent has been driven off, the nanoparticles are compressed or compacted by applying pressure and heat to the nanoparticle perform (indicated by box 182 in FIG. 14). The pressure may be mechanically generated or pneumatically generated and may be applied statically, dynamically, or statically and dynamically. By way of example, the applied pressure is less than about 20 MPa at a temperature of less than about 400° C. Compaction may also be carried out in an ambient such as, for example, an atmospheric ambient, an ambient comprising an inert gas, an ambient comprising a vacuum, etc. Thus, variables that can be adjusted to compact or compress the nanoparticles include the ambient, temperature, pressure, drying conditions, or combinations thereof. Compaction of the nanoparticles on the substrate forms a nanoparticle preform 26B (shown in FIG. 16) that is similar to nanoparticle preform 26 except that it is formed from a suspension. Nanoparticle preform 26B may be referred to as a NanoPac.

A workpiece such as, for example, a semiconductor chip 40 is mounted to nanoparticle preform 26B (indicated by box 184 in FIG. 14). Nanoparticle preform 26B is sintered by being placed in an ambient and applying pressure and heat to the nanoparticle preform. The pressure may be mechanically generated or pneumatically generated and may be applied statically, dynamically, or statically and dynamically. By way of example, the applied pressure is less than about 20 MPa at a temperature of less than about 400° C. Sintering nanoparticle preform 26B is also referred to as heating nanoparticle preform 26B and is indicated by box 186 in FIG. 14. The structure comprising the substrate, semiconductor chip 40, and nanoparticle preform 26B is soaked in a solvent to remove an organic passivation layer that may be present. After removal of the organic passivation layer, the structure is dried in an atmospheric ambient. Alternatively, the structure can be dried in an ambient comprising one or more inert gases or under vacuum. It should be noted that the workpiece is not limited to being a semiconductor chip. Alternatively, the workpiece may be a capacitor such as, for example a chip capacitor, a resistor, such as, for example, a chip resistor, an inductor, a leadframe, a printed circuit board, a clip connector or the like.

Figure 16:
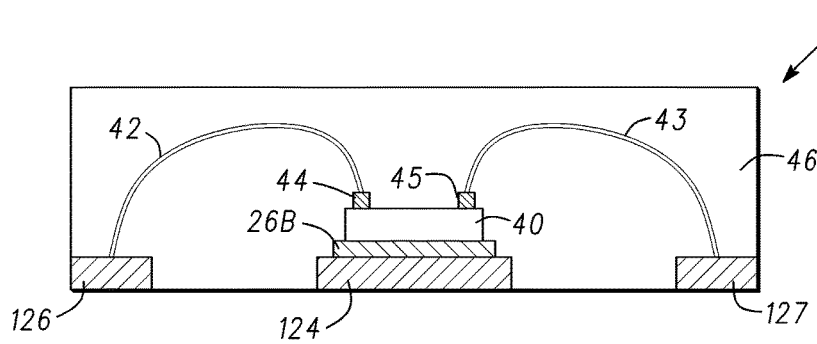
FIG. 16 is a cross-sectional view of the semiconductor component of FIG. 15 at a later stage of manufacture.

The substrate, semiconductor chip 40, and nanoparticle preform 26B may be packaged to form a semiconductor component 196 (indicated by box 188 in FIG. 14). FIG. 16 illustrates a semiconductor component 196 in which the substrate 122 is, for example, a copper leadframe having a flag 124 and leadframe leads 126, and semiconductor chip 40 is coupled to leadframe 122 via nanoparticle preform 26B. In addition, bond pads 44 and 45 formed on or from semiconductor chip 40 are coupled to leadframe leads 126 and 127 via corresponding bond wires 42 and 43, respectively. A mold compound 46 is formed over at least portions of leadframe 122, semiconductor chip 40, and bond wires 42 and 43. Semiconductor chip 40, bond wires 42 and 43, and mold compound 46 have been described with reference to FIG. 6.

Figure 17:
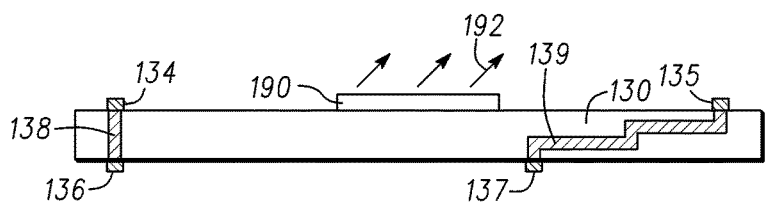
FIG. 17 is a cross-sectional view of a semiconductor component during manufacture in accordance with an embodiment of the present invention.
Figure 18:
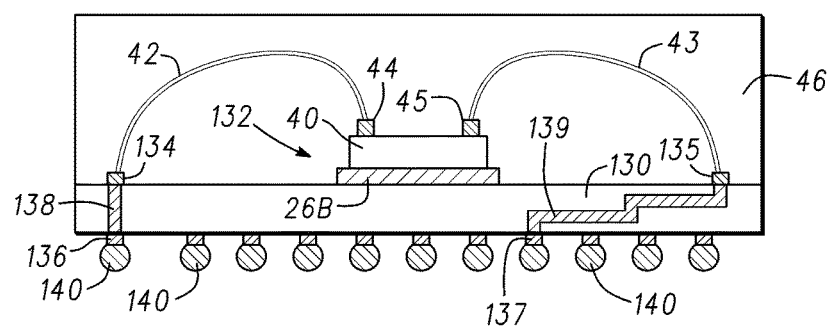
FIG. 18 is a cross-sectional view of the semiconductor component of FIG. 17 at a later stage of manufacture.

FIGS. 17 and 18 illustrate a semiconductor component 200 in accordance with an embodiment in which the substrate is a printed circuit board 130. An embodiment of printed circuit board 130 is described with reference to FIG. 12. What is shown in FIG. 17 is nanoparticle suspension 190 dispensed onto printed circuit board 130. The solvent is driven off or removed (indicated by arrows 192) by applying pressure and heat to the nanoparticle suspension. The pressure may be mechanically generated or pneumatically generated and may be applied statically, dynamically, or statically and dynamically. By way of example, the applied pressure is less than about 20 MPa at a temperature of less than about 400° C. as indicated by box 180 to form nanoparticle preform 26B. Thus, nanoparticle preform 26B is formed on a semiconductor chip receiving area 132.

Solder bumps 140 are coupled to corresponding bond pads 136 and 137, respectively. It should be noted that bond pads 134 and 135 and bond pads 136 and 137 are located on opposite sides of printed circuit board 130. Bond pads 44 and 45 on semiconductor chip 40 are coupled to bond pads 134 and 135 on printed circuit board 130 via bond wires 42 and 43, respectively. It should be further noted that the number of bond pads on semiconductor chip 40, bond pads on printed circuit board 130, bond wires, interconnects and solder balls are not limitations of the present invention. Formation of bond pads, bond wires, interconnects, and solder bumps with regard to printed circuit board 30 have been described with reference to FIG. 12.

A mold compound 46 is formed over at least a portion of printed circuit board 130, semiconductor chip 40, and bond wires 42 and 43. Semiconductor chip 40, bond wires 42 and 43, and mold compound 46 have been described with reference to FIG. 6.

Figure 19:
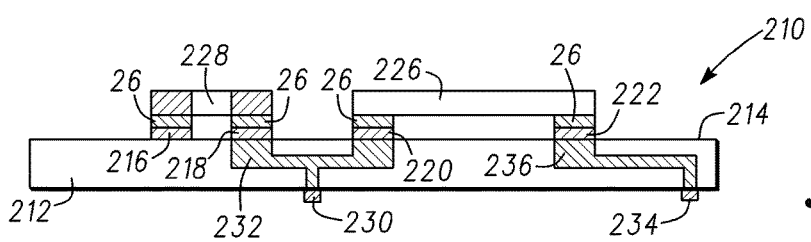
FIG. 19 is a cross-sectional view of a semiconductor component in accordance with another embodiment of the present invention.

FIG. 19 is a cross-sectional view of a semiconductor component 210 in accordance with another embodiment.

What is shown in FIG. 19 is a printed circuit board 212 having a surface 214 on which bond pads 216, 218, 220, and 222 are formed. Nanoparticle preforms 26 are formed on bond pads 216-222. The nanoparticle preforms are not limited to preforms 26, but may be preforms such as, for example, preforms 26A, 26B, or the like. A semiconductor component 226 is coupled to bond pads 220 and 222. Semiconductor component 226 may be a packaged semiconductor component or it may be a semiconductor chip mounted in a flip-chip or chip scale packaging configuration. A passive component 228 is coupled to bond pads 216 and 218 through nanoparticle preforms 26. By way of example, passive component 228 is a chip capacitor. Alternatively, passive component 228 may be a chip resistor, a resistor, a capacitor, an inductor, etc. Printed circuit board 212 includes a bond pad 230 coupled to bond pads 218 and 220 through an interconnect 232 and a bond pad 234 coupled to bond pad 222 through an interconnect 236. Although not shown, semiconductor component 210 may include a protective structure formed over semiconductor component 226, passive component 228, or both and it may include solder bumps coupled to bond pads 230 and 234.

Figure 20:
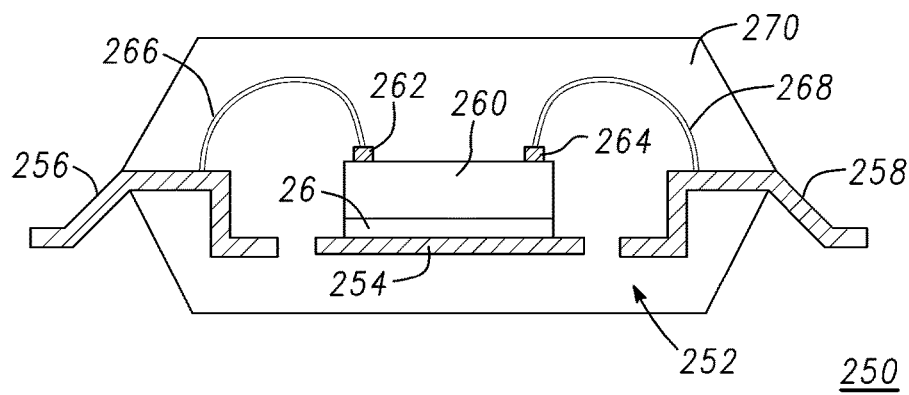
FIG. 20 is a cross-sectional view of a semiconductor component in accordance with another embodiment of the present invention.

FIG. 20 is a cross-sectional view of a surface mount semiconductor component 250 in accordance with another embodiment of the present invention. What is shown in FIG. 20 is a cross-sectional view of a portion of a leadframe 252 having a flag 254 and leadframe leads 256 and 258. Flag 254 may also be referred to as a chip receiving area. A nanoparticle preform 26 is formed on flag 254. The nanoparticle preform is not limited to preform 26, but may be a preform such as, for example, a preform 26A, 26B, or the like. A semiconductor chip 260 having bond pads 262 and 264 is mounted to nanoparticle preform 26 which is sintered by, for example, placing nanoparticle preform 26 in an atmospheric ambient, an ambient comprising one or more inert gases, an ambient comprising a forming gas or a vacuum, and applying pressure and heat to the nanoparticle preform. The pressure may be mechanically generated or pneumatically generated and may be applied statically, dynamically, or statically and dynamically. By way of example, the applied pressure is less than about 20 MPa at a temperature of less than about 400° C.

Still referring to FIG. 20, bond pad 262 is coupled to leadframe lead 256 by a wire bond 266 and bond pad 264 is coupled to leadframe lead 258 by a wire bond 268. A protective material 270 such as, for example, a mold compound is formed over semiconductor die 260, bond wires 266 and 268, leadframe leads 256 and 258, and flag 254 to form surface mount semiconductor component 250. Bond wires are also referred to as wire bonds. It should be understood that surface mount semiconductor component 250 may be a small outline package, a chip carrier, a leadless chip carrier, a plastic leadless chip carrier, etc.

Figure 21:
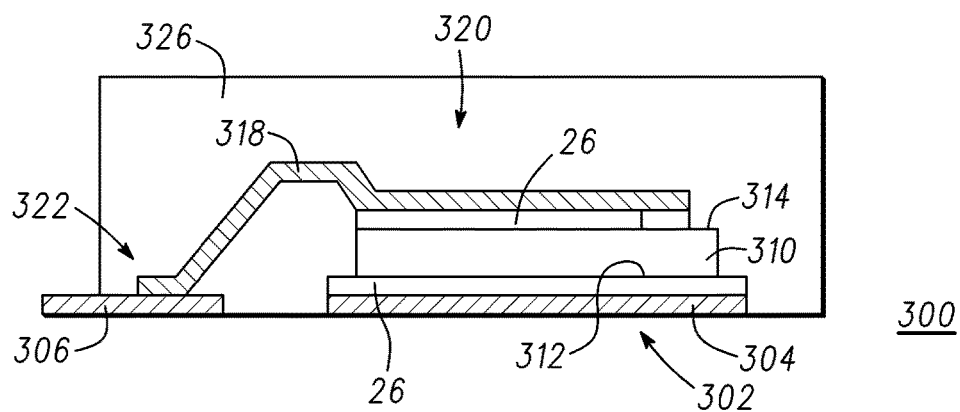
FIG. 21 is a cross-sectional view of a semiconductor component in accordance with another embodiment of the present invention.

FIG. 21 is a cross-sectional view of a semiconductor component 300 in accordance with another embodiment of the present invention. What is shown in FIG. 21 is a cross-sectional view of a portion of a leadframe 302 having a flag 304 and a leadframe lead 306. Flag 304 may also be referred to as a chip receiving area. A nanoparticle preform 26 is formed on flag 304. The nanoparticle preform is not limited to preform 26, but may be a preform such as, for example, a preform 26A, 26B, or the like. A semiconductor chip 310 having surfaces 312 and 314 is mounted to nanoparticle preform 26. More particularly, surface 312 is placed in contact with nanoparticle preform 26. Another nanoparticle preform 26 is formed on surface 314 of semiconductor chip 310. A clip 318 is mounted on nanoparticle preform 26.

It should be noted that clip 318 has regions 320 and 322 and that region 320 is mounted to nanoparticle preform 26 and region 322 may be bonded to leadframe lead 306 by solder (not shown). Nanoparticle preforms 26 are sintered by, for example, placing them in or treating with an atmospheric ambient, an ambient comprising one or more inert gases, an ambient comprising a forming gas or a vacuum, and applying pressure and heat to the nanoparticle preform. The pressure may be mechanically generated or pneumatically generated and may be applied statically, dynamically, or statically and dynamically. By way of example, the applied pressure is less than about 20 MPa at a temperature of less than about 400° C.

A protective material 326 such as, for example, a mold compound is formed over semiconductor die 310, flag 304, clip 318, and a portion of leadframe lead 306.

Although specific embodiments have been disclosed herein, it is not intended that the invention be limited to the disclosed embodiments. Those skilled in the art will recognize that modifications and variations can be made without departing from the spirit of the invention. It is intended that the invention encompass all such modifications and variations as fall within the scope of the appended claims.

What is claimed is:

1. A method for bonding components, comprising:
providing a nanoparticle preparation using a process in which sintering is absent, nanoparticle preparation consisting essentially of unpassivated nanoparticles derived using a top down nanoparticle synthesis process; and
compacting the nanoparticle preparation, wherein providing the nanoparticle preparation includes providing the nanoparticle preparation as a nanoparticle suspension and further including applying the nanoparticle suspension to a substrate and driving off the solvent from the nanoparticle suspension and wherein compacting the nanoparticles preparation where sintering is absent forms a nanoparticle structure.

2. The method of claim 1, further including mounting a semiconductor chip to the nanoparticle structure.

3. The method of claim 2, wherein applying the nanoparticle suspension to the substrate includes applying the nanoparticle suspension to a printed circuit board.

4. The method of claim 2, wherein applying the nanoparticle suspension to the substrate includes applying the nanoparticle suspension to a leadframe.

5. The method of claim 1, wherein providing the nanoparticle preparation includes suspending nanoparticles in a liquid.

6. The method of claim 5, wherein suspending the nanoparticles in the liquid includes suspending the nanoparticles in an organic solvent.

7. The method of claim 5, wherein suspending the nanoparticles in the liquid includes suspending the nanoparticles in an aqueous solution.

8. A method for bonding components, comprising:
providing a nanoparticle suspension consisting essentially of unpassivated nanoparticles of copper, nickel, or silver suspended in a liquid, wherein the unpassivated nanoparticles have a size of less than 500 nanometers and are derived using a top down nanoparticle synthesis process;
dispensing the unpassivated nanoparticle suspension into a mold;
removing the liquid portion of the unpassivated nanoparticle suspension by evaporation; and compacting the unpassivated nanoparticles to form a nanoparticle preform, wherein compacting the unpassivated nanoparticles includes applying pressure to the unpassivated nanoparticles of less than 20 MegaPascals and a compaction temperature ranging from about 150 Degrees Celsius to 400 degrees Celsius.

9. The method of claim 8, wherein providing the nanoparticle suspension includes combining the unpassivated nanoparticles with the liquid includes combining the unpassivated nanoparticles with a liquid selected from the group of liquids comprising alcohol, acetone, and an organic solvent.

10. The method of claim 8, wherein combining the unpassivated nanoparticles with the liquid includes combining unpassivated copper nanoparticles.

11. The method of claim 8, wherein providing the unpassivated nanoparticle suspension includes providing the unpassivated nanoparticle suspension as a colloidal suspension.

12. The method of claim 8, wherein compacting the unpassivated nanoparticles includes compacting the unpassivated nanoparticles in an ambient comprising an inert gas.

13. The method of claim 12, wherein the unpassivated nanoparticles have a size ranging from 50 nanometers to 100 nanometers and compacting the unpassivated nanoparticles includes applying a pressure ranging from 5 MegaPascals to 10 MegaPascals at a compaction temperature ranging from 150 Degrees Celsius to 200 Degrees Celsius.

14. The method of claim 12, wherein applying pressure to the unpassivated nanoparticles includes applying the pressure mechanically or pneumatically.

15. A method for bonding components, comprising:
forming an unpassivated nanoparticle suspension by combining unpassivated nanoparticles with a liquid, wherein the liquid is one of alcohol or acetone, and wherein the unpassivated nanoparticles are selected from the group of unpassivated nanoparticles consisting of copper, nickel, and silver that are derived using a top down nanoparticle synthesis process and have a size of less than 500 nanometers;
dispensing the unpassivated nanoparticle suspension onto a substrate;
driving off the liquid by applying pressure and heat to the substrate; and
compressing the unpassivated nanoparticles to form a nanoparticle preform, wherein compressing the unpassivated nanoparticles includes applying pressure to the unpassivated nanoparticles of less than 20 MegaPascals and a compaction temperature ranging from about 150 Degrees Celsius to 400 Degrees Celsius.

16. The method of claim 15, wherein forming the unpassivated nanoparticle suspension includes mixing unpassivated silver nanoparticles with the liquid.

17. The method of claim 15, wherein heating the nanoparticle preform includes applying pressure to the nanoparticle preform, wherein the pressure is generated mechanically or pneumatically.

18. The method of claim 15, wherein the unpassivated nanoparticle suspension is a colloidal suspension.

19. The method of claim 15, wherein the unpassivated nanoparticles have a size ranging from 100 nanometers to 200 nanometers and compacting the unpassivated nanoparticles includes applying a pressure ranging from 10 MegaPascals to 15 MegaPascals at a compaction temperature ranging from 250 Degrees Celsius to 300 Degrees Celsius.

20. The method of claim 15, wherein the unpassivated nanoparticles have a size ranging from 200 nanometers to 499 nanometers and compressing the unpassivated nanoparticles includes applying a pressure ranging from 15 MegaPascals to 20 MegaPascals at a compression temperature ranging from 350 Degrees Celsius to 400 Degrees Celsius.

* * * * *